United States Patent
Jeon et al.

(10) Patent No.: US 8,895,439 B2
(45) Date of Patent: Nov. 25, 2014

(54) METHOD FOR FORMING PATTERN AND METHOD FOR MANUFACTURING DISPLAY DEVICE BY USING THE SAME

(75) Inventors: Woo-Seok Jeon, Seoul (KR); Jong Kwang Lee, Daejeon (KR); Jin Ho Ju, Seoul (KR); Min Kang, Seoul (KR); Hoon Kang, Suwon-si (KR); Seung Bo Shim, Asan-si (KR); Gwui-Hyun Park, Osan-si (KR); Bong-Yeon Kim, Seoul (KR); Seon-Il Kim, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 229 days.

(21) Appl. No.: 13/486,858

(22) Filed: Jun. 1, 2012

(65) Prior Publication Data
US 2013/0017637 A1   Jan. 17, 2013

(30) Foreign Application Priority Data
Jul. 12, 2011   (KR) .......................... 10-2011-0068953

(51) Int. Cl.
*H01L 21/00* (2006.01)
*G03F 7/20* (2006.01)

(52) U.S. Cl.
CPC . *G03F 7/203* (2013.01); *G03F 7/20* (2013.01); *G03F 7/70466* (2013.01); *Y10S 438/942* (2013.01)
USPC .............................. 438/669; 438/29; 438/942

(58) Field of Classification Search
CPC ........ G03F 7/20; G03F 7/203; G03F 7/70466
USPC ............................................ 438/669, 29, 942
See application file for complete search history.

(56) References Cited

U.S. PATENT DOCUMENTS

| | | | |
|---|---|---|---|
| 6,743,554 B2 * | 6/2004 | Nakao ............................... | 430/5 |
| 7,147,992 B2 * | 12/2006 | Itou et al. ...................... | 430/321 |
| 7,534,557 B2 * | 5/2009 | Tachikawa et al. ........... | 430/321 |
| 2007/0224521 A1 * | 9/2007 | Furukawa ......................... | 430/5 |
| 2010/0167206 A1 * | 7/2010 | Jeon et al. .................. | 430/281.1 |
| 2011/0207030 A1 * | 8/2011 | Shirasaki et al. ................. | 430/5 |

* cited by examiner

*Primary Examiner* — Luan C Thai
(74) *Attorney, Agent, or Firm* — H.C. Park & Associates, PLC

(57) ABSTRACT

A method for forming a fine exposure pattern where a width and an interval of the pattern are each 1CD, by first exposing a photoresist by using an exposure mask where an interval ratio of a light shielding part and a light transmission part is 2CD:1CD to 4CD:1CD, and then second exposing the photoresist after the exposure mask is shifted at a predetermined interval, or second exposing the photoresist by using an exposure mask formed at a position where a light transmission part is shifted at a predetermined interval, and developing the photoresist, such that it is possible to form a display device having a pixel electrode including a plurality of fine branch electrodes having a smaller width and interval than a resolution of an exposure apparatus.

19 Claims, 14 Drawing Sheets

METHOD FOR FORMING PATTERN AND METHOD FOR MANUFACTURING DISPLAY DEVICE BY USING THE SAME

CROSS-REFERENCE TO RELATED APPLICATION

This application claims priority from and the benefit of Korean Patent Application No. 10-2011-0068953, filed Jul. 12, 2011, which is hereby incorporated by reference for all purposes as if fully set forth herein.

BACKGROUND

1. Field

Exemplary embodiments of the present invention relate to a method for forming a pattern and a method for manufacturing a display device by using the same.

2. Discussion of the Background

A liquid crystal display, which is one of the most common types of flat panel displays currently in use, includes two display panels on which electrodes are formed and a liquid crystal layer interposed therebetween, and controls the amount of light transmitted by applying voltage to the electrodes.

In the liquid crystal display, by forming the pixel electrode having a plurality of fine branch electrodes, the liquid crystal molecule has a pretilt angle along a side of the fine branch electrode, thus implementing a liquid crystal display where a response speed of the liquid crystal molecule becomes rapid, and a wide viewing angle is implemented.

However, like a plurality of fine branch electrodes, when a width of a pattern is very narrow, it is difficult to form a precise pattern by a general resolution of a current light exposer.

In detail, a pattern where a width of the pattern and an interval between the patterns are each about 3 µm may be formed by a current light exposer resolution, but it is very difficult to form a pattern having a narrower width and interval as compared to the pattern.

The above information disclosed in this Background section is only for enhancement of understanding of the background of the invention and therefore it may contain information that does not form the prior art that is already known in this country to a person of ordinary skill in the art.

SUMMARY OF THE INVENTION

Exemplary embodiments of the present invention provide an exposure method for forming a pattern having a width smaller than a resolution of a light exposer, and a method for forming a display device having a pixel electrode including a plurality of fine branch electrodes having a small width and interval by using the same.

An exemplary embodiment of the present invention discloses a method for forming a pattern, including: depositing a photoresist on a substrate; first exposing the photoresist by using a photomask where an interval ratio of a light shielding part and a light transmission part is 2CD:1CD to 4CD:1CD, (where "CD" means "critical dimension"); second exposing the first exposed photoresist after the photomask is horizontally shifted at a predetermined interval; and developing the second exposed photoresist.

The interval ratio of the light shielding part and the light transmission part of the photomask may be about 2 µm:1 µm to about 4 µm:1 µm.

A width and an interval of the pattern may be about 1 µm.

A width and an interval of the pattern may be about 1 CD.

An exemplary embodiment of the present invention also discloses a method for forming a pattern, including: depositing a photoresist on a substrate; first exposing the photoresist by using a first photomask where an interval ratio of a light shielding part and a light transmission part is 2CD:1CD to 4CD:1CD; second exposing the first exposed photoresist by using a second photomask that has a light shielding part and a light transmission part at a position that is horizontally shifted at a predetermined interval from the position of the light shielding part and the light transmission part of the first photomask and where an interval ratio of the light shielding part and the light transmission part is 2CD:1CD to 4CD:1CD; and developing the second exposed photoresist.

An exemplary embodiment of the present invention also discloses a method for forming a display device, including: laminating a conductive layer on a substrate; depositing a photoresist on the conductive layer; first exposing the photoresist by using a photomask where an interval ratio of a light shielding part and a light transmission part is 2CD:1CD to 4CD:1CD; second exposing the first exposed photoresist after the photomask is horizontally shifted at a predetermined interval, or second exposing the first exposed photoresist by using a second photomask that has a light shielding part and a light transmission part at a position that is horizontally shifted at a predetermined interval from the position of the light shielding part and the light transmission part of the first photomask and where an interval ratio of the light shielding part and the light transmission part is 2CD:1CD to 4CD:1CD; developing the second exposed photoresist; and forming a conductive layer pattern by etching the conductive layer by using the developed photoresist as an etching mask.

The interval ratio of the light shielding part and the light transmission part of the photomask may be about 2 µm:1 µm to about 4 µm:1 µm.

A width and an interval of the pattern may be about 1 µm.

A width and an interval of the pattern may be about 1 CD.

The conductive layer may be a transparent conductive layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1A:
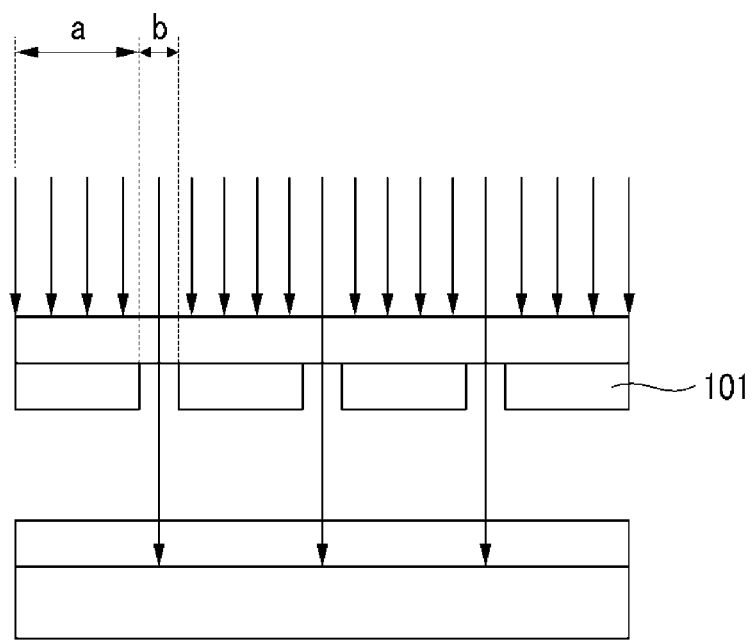
FIG. 1A, FIG. 1B, and FIG. 1C are views that illustrate an exposure method according to a first exemplary embodiment of the present invention.

The invention will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers, films, panels, regions, etc., may be exaggerated for clarity. Like reference numerals in the drawings denote like elements.

It will be understood that when an element such as a layer, film, region, or substrate is referred to as being "on" or "connected to" another element, it can be directly on or directly connected to the other element, or intervening elements may also be present. In contrast, when an element is referred to as being "directly on" or "directly connected to" another element, there are no intervening elements present. It will be understood that for purposes of this disclosure, "at least one of X, Y, and Z" can be construed as X only, Y only, Z only, or any combination of two or more items X, Y, and Z (e.g., XYZ, XYY, YZ, ZZ).

Figure 1B:
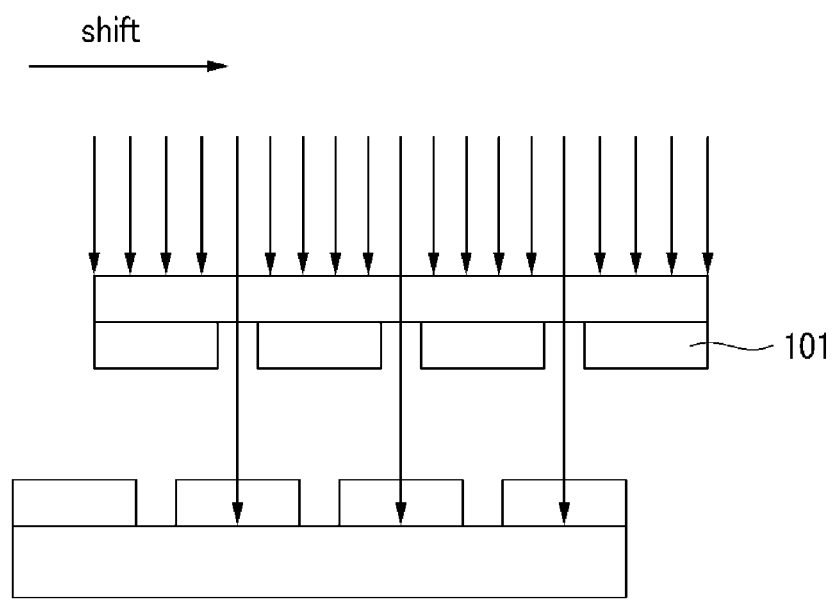
Figure 1C:
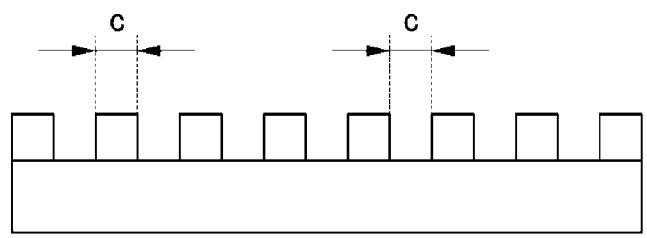

First, with reference to FIG. 1A to FIG. 1C, an exposure method according to an exemplary embodiment of the present invention will be described. FIG. 1A to FIG. 1C are views that illustrate an exposure method according to an exemplary embodiment of the present invention.

With reference to FIG. 1A, first exposing is performed by using a first photomask 101 where an interval ratio between a light shielding part a and a light transmission part b is 3CD:1CD, (where "CD" means "critical dimension").

Thereafter, referring to FIG. 1B and FIG. 1C, it is possible to form a pattern where a width c and an interval c are 1CD by performing second exposing and developing after shifting the first mask 101 aside by 2CD.

In detail, the interval between the light shielding part a and light transmission part b may be about 3 μm or more and about 1 μm or more, and the width and the interval of the formed pattern may be about 1 μm.

However, a method for forming the pattern according to the exemplary embodiment of the present invention is not limited to the above exemplary embodiment. The photomask where the interval ratio between the light shielding part a and the light transmission part b is 2CD:1CD to 4CD:1CD may be used, and it is possible to form a pattern where the width and the interval are 1CD by controlling a horizontal distance shifted according to each ratio.

Figure 2A:
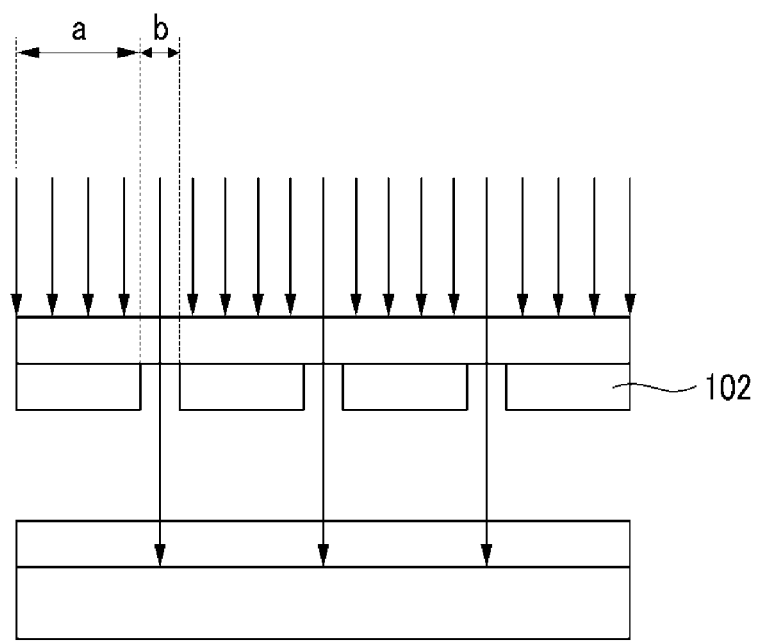
FIG. 2A, FIG. 2B, and FIG. 2C are views that illustrate an exposure method according to a second exemplary embodiment of the present invention.
Figure 2B:
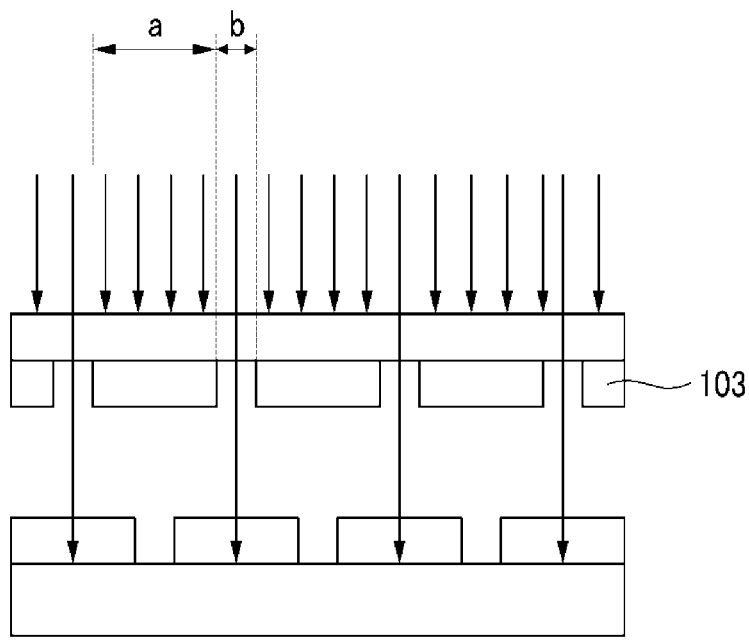
Figure 2C:
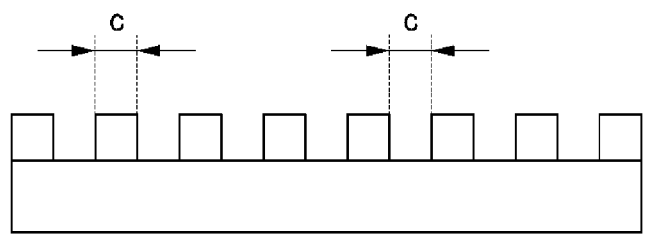

Next, with reference to FIG. 2A to FIG. 2C, an exposure method according to an exemplary embodiment of the present invention will be described. FIG. 2A to FIG. 2C are views that illustrate an exposure method according to an exemplary embodiment of the present invention.

Referring to FIG. 2A, first exposing is performed by using a second photomask 102 where an interval ratio between a light shielding part a and a light transmission part b is 3CD:1CD.

Thereafter, referring to FIG. 2B and FIG. 2C, it is possible to form a pattern where a width c and an interval c are 1CD by performing second exposing and developing by using a third mask 103 where the interval ratio between the light shielding part a and the light transmission part b is 3CD:1CD but the positions of the light shielding part a and the light transmission part b are shifted by 2CD as compared to the second mask 102.

In detail, the interval between the light shielding part a and the light transmission part b may be about 3 μm or more and about 1 μm or more, and the width and the interval of the formed pattern may be about 1 μm.

However, a method for forming the pattern according to the exemplary embodiment of the present invention is not limited to the above exemplary embodiment. The photomask where the interval ratio between the light shielding part a and the light transmission part b is 2CD:1CD to 4CD:1CD may be used, and it is possible to form a pattern where the width and the interval are 1CD by controlling a horizontal distance where the position of the light shielding part a and the light transmission part b is disposed according to each ratio.

Figure 3A:
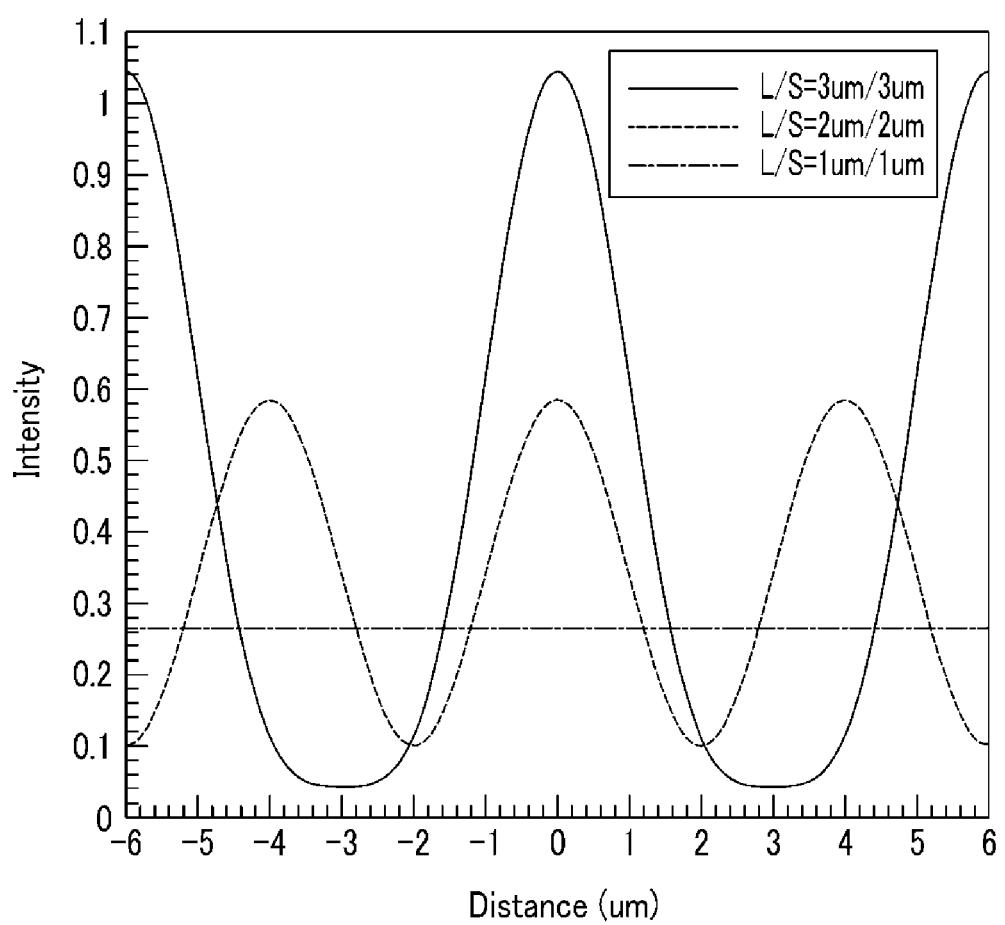
FIG. 3A and FIG. 3B are views that illustrate resolution of a light exposer.
Figure 3B:
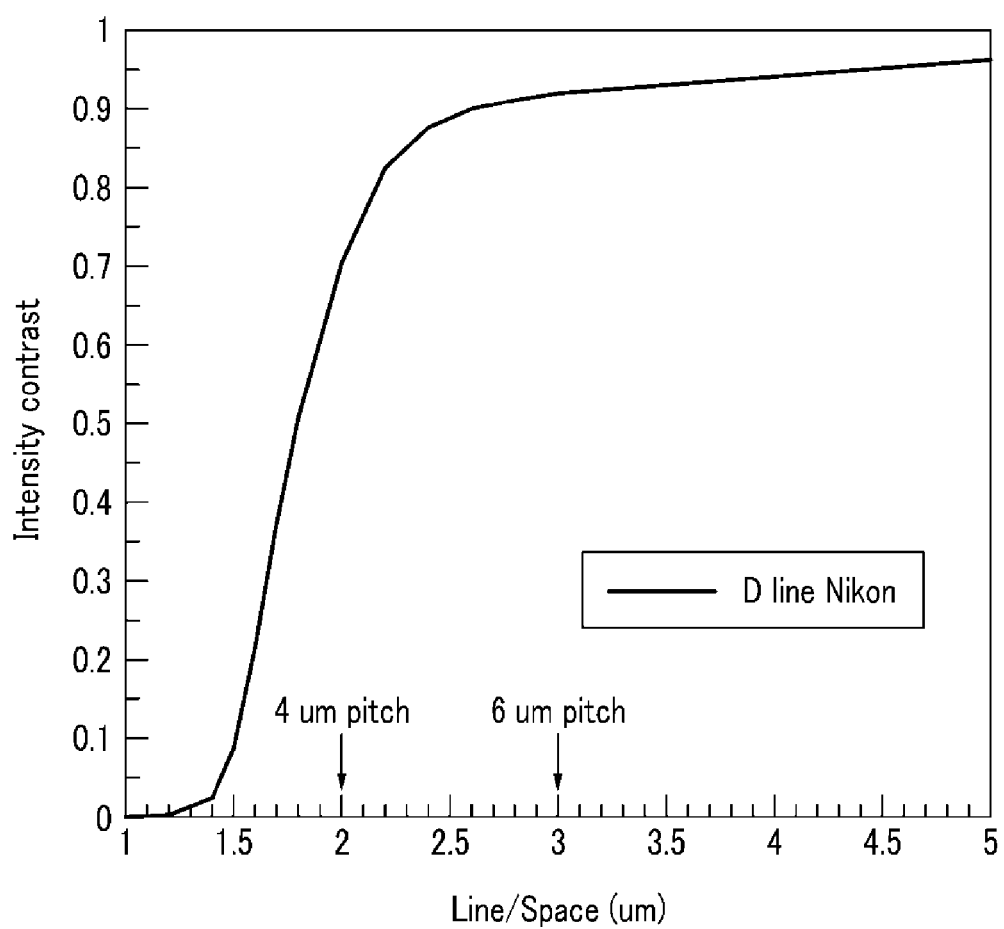

Then, with reference to FIG. 3A and FIG. 3B, resolution of the light exposer will be described. FIG. 3A and FIG. 3B are views that illustrate resolution of a light exposer. In detail, FIG. 3A is a graph that illustrates the intensity of light according to a distance from a light transmission part when exposing is performed by the light exposer according to the width of the light shielding part L and the light transmission part S of the photomask, and FIG. 3B is a graph that illustrates the intensity contrast of light when exposing is performed by the light exposer according to the width of the light shielding part L and the light transmission part S.

Referring to FIG. 3A, in the case where the widths of the light shielding part L and the light transmission part S of the photomask are each 3 μm, the intensity of light is the strongest at the center of the light transmission part (x=0), and the intensity of light is largely decreased as going to the circumference. Accordingly, in this case, it is possible to form the pattern using the exposing. However, in the case where the widths of the light shielding part L and the light transmission part S of the photomask are each 2 μm, a difference between intensities of light applied to the center and the circumference of the light transmission part (x=0) is gradually decreased, and in the case where the widths of the light shielding part L and the light transmission part S of the photomask are each 1 μm, there is little difference between intensities of light applied to the center and the circumference of the light transmission part (x=0) by diffraction of light. Accordingly, in the case where the pattern is formed by using a general light exposer currently in use, it is possible to form the pattern having a width and an interval of about 3 μm by the smallest pattern.

With reference to FIG. 3B, if the intensity contrast is reviewed, when the widths of the light shielding part L and light transmission part S of the photomask are each larger than 2 μm, the intensity contrast of light is about 0.7 or more. In general, in the case where the intensity contrast of light is about 0.7 or more, it is possible to stably form the pattern. Accordingly, in the case where the pattern is formed by using a general light exposer currently in use, it is possible to form the pattern having a width and an interval of about 3 µm by the smallest pattern.

Figure 4A:
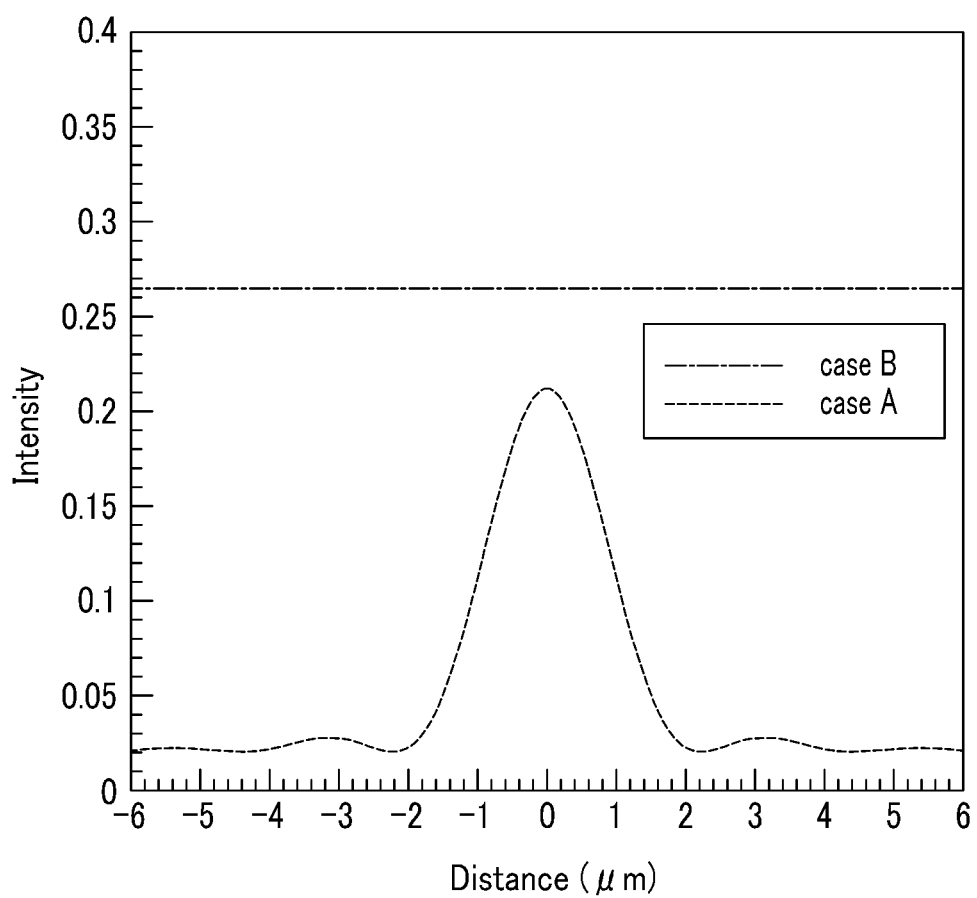
FIG. 4A and FIG. 4B are views that illustrate an exposure resolution.
Figure 4B:
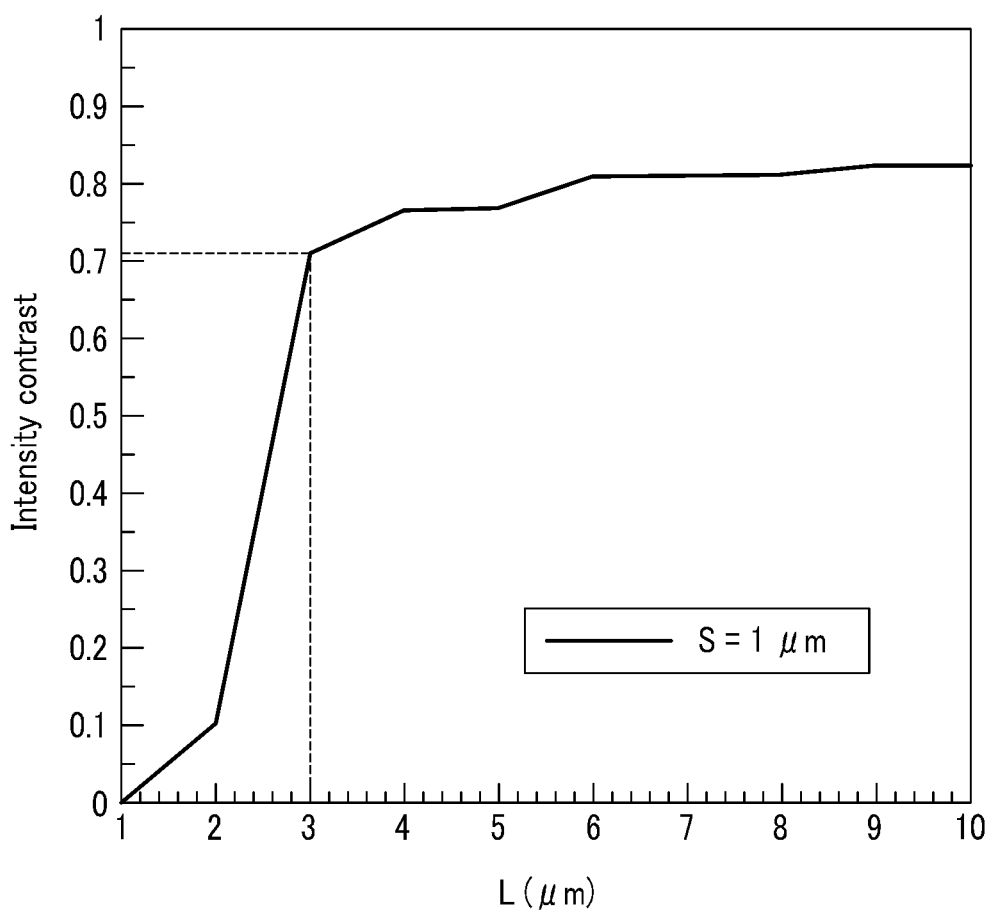

Next, with reference to FIG. 4A and FIG. 4B, an exposure resolution according to the photomask will be described. FIG. 4A and FIG. 4B are views that illustrate an exposure resolution.

In detail, FIG. 4A is a graph that illustrates the intensity of light according to the distance from the light transmission part in the case where exposing is performed by using the mask where the widths of the light shielding part L and the light transmission part S of the photomask are 3 µm and 1 µm, respectively, and the intensity of light according to the distance from the light transmission part in the case where exposing is performed by using the mask where the widths of the light shielding part L and the light transmission part S of the photomask are each 1 µm, and FIG. 4B is a graph that illustrates the intensity contrast of light according to the width of the light shielding part L in the case where the width of the light transmission part S is about 1 µm.

Referring to FIG. 4A, in the case A where exposing is performed by using the mask where the widths of the light shielding part and the light transmission part of the photomask are 3 µm and 1 µm, respectively, the intensity of light at the center of the light transmission part (x=0) is the strongest, and the intensity of light is largely decreased as going to the circumference. However, in the case B where exposing is performed by using the mask where the widths of the light shielding part and the light transmission part of the photomask are each 1 µm, there is little difference between intensities of light applied to the center and the circumference of the light transmission part (x=0) by diffraction of light. Accordingly, in the case where exposing is performed by using the mask where the widths of the light shielding part and the light transmission part of the photomask are 3 µm and 1 µm, respectively, it is possible to stably form the pattern.

Referring to FIG. 4B, in the case where the width of the light transmission part S is about 1 µm, and in the case where the width of the light shielding part L is at least about 2 µm or more, an increase in the intensity contrast of light becomes large.

Accordingly, like the method for forming the pattern according to the exemplary embodiment of the present invention, it is possible to form a fine pattern where a width and an interval of the pattern are 1CD, in detail, about 1 µm, by first exposing a photoresist by using an exposure mask where an interval ratio of a light shielding part and a light transmission part is 2CD:1CD to 4CD:1CD, in detail, the interval ratio is 2 µm:1 µm to 4 µm:1 µm, and then second exposing the photoresist after the exposure mask is shifted at a predetermined interval, or second exposing the photoresist by using an exposure mask formed at a position where a light shielding part and a light transmission part is shifted at a predetermined interval, and developing the photoresist, such that it is possible to form a display device having a pixel electrode including a plurality of fine branch electrodes having a smaller width and interval than a resolution of an exposure apparatus.

Figure 5:
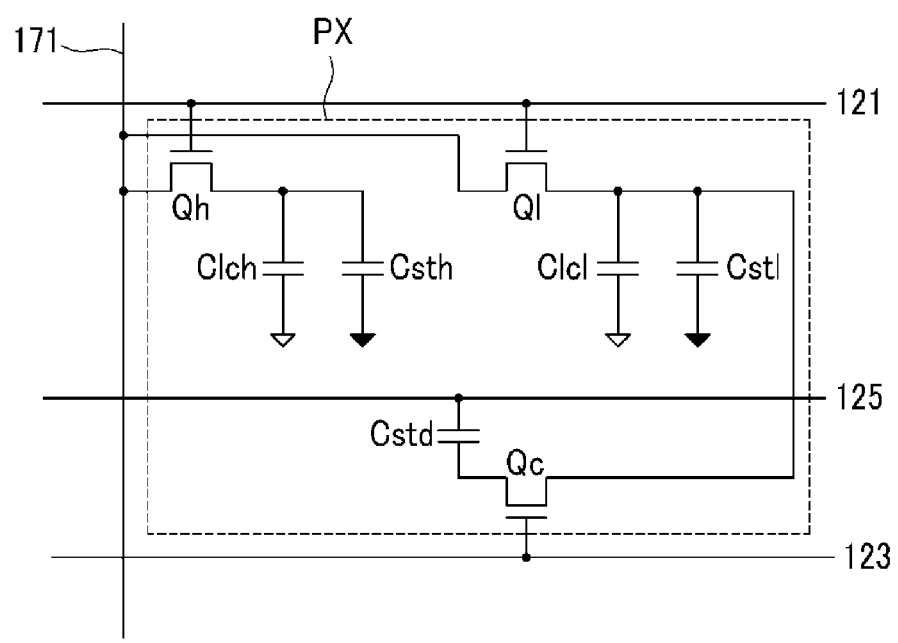
FIG. 5 is an equivalent circuit diagram illustrating one pixel of the liquid crystal display according to an exemplary embodiment of the present invention.
Figure 6:
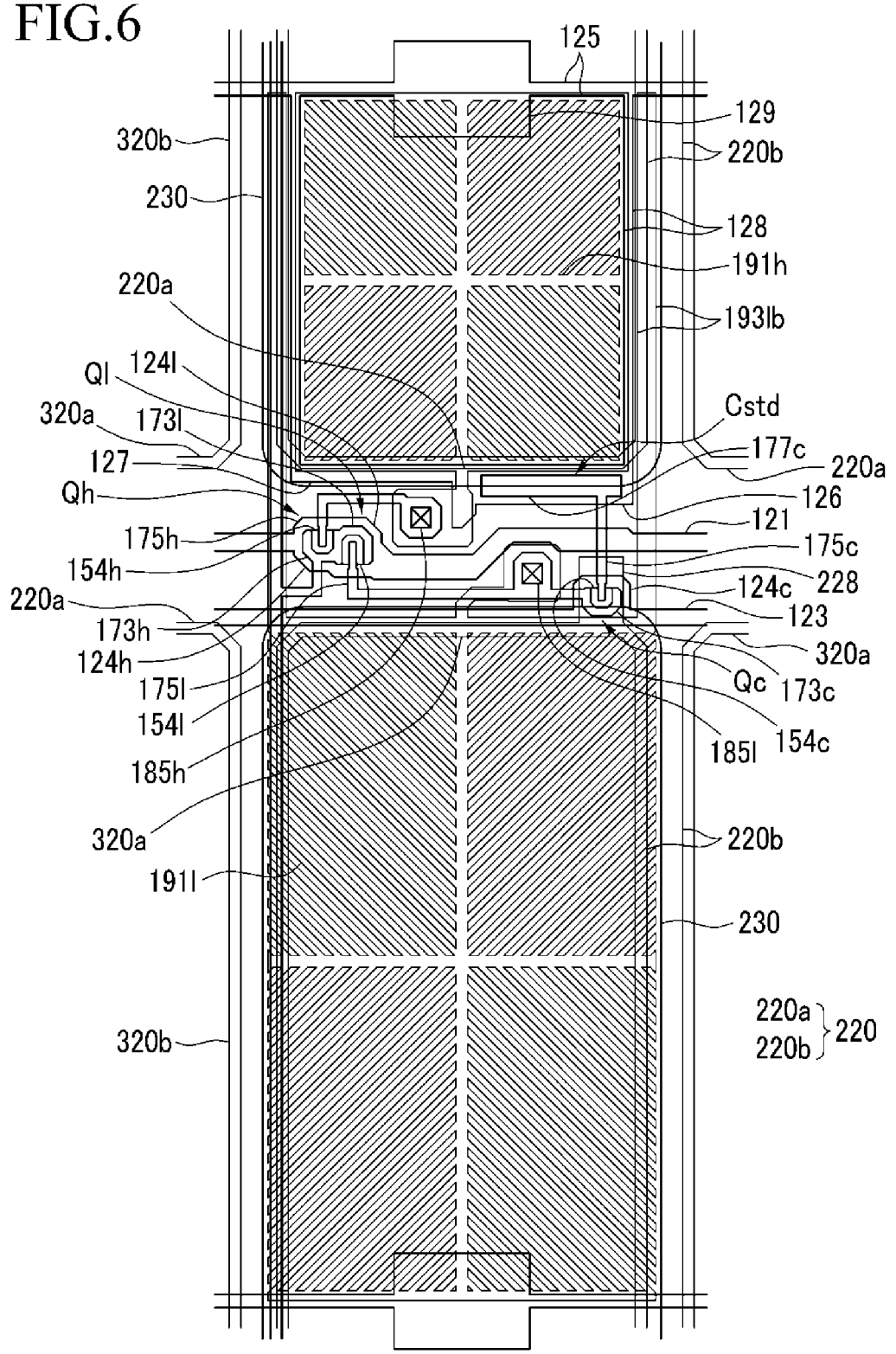
FIG. 6 is a layout view of a liquid crystal display according to an exemplary embodiment of the present invention.
Figure 7:
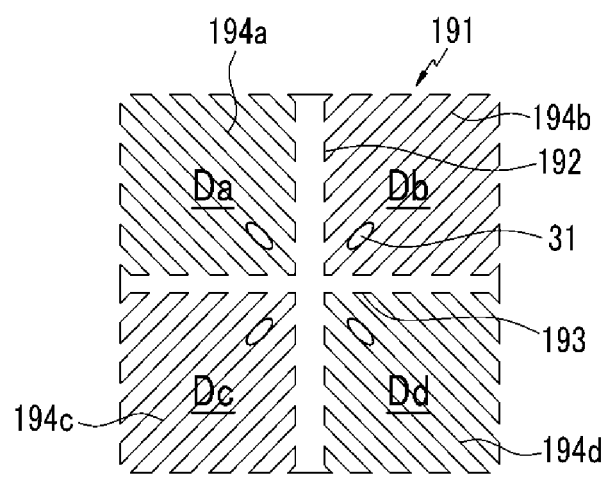
FIG. 7 is a basic layout view illustrating a shape of the pixel electrode of the liquid crystal display according to an exemplary embodiment of the present invention.

Hereinafter, a liquid crystal display according to an exemplary embodiment of the present invention will be described in detail with reference to FIG. 5 to FIG. 7. FIG. 5 is an equivalent circuit diagram illustrating one pixel of the liquid crystal display according to an exemplary embodiment of the present invention, FIG. 6 is a layout view of a liquid crystal display according to an exemplary embodiment of the present invention, and FIG. 7 is a basic layout view illustrating a shape of the pixel electrode of a liquid crystal display according to an exemplary embodiment of the present invention.

Referring FIG. 5, the liquid crystal display according to the exemplary embodiment of the present invention includes a signal line that includes a gate line 121, a storage electrode line 125, a voltage drop gate line 123 and data line 171, and a pixel PX that is connected thereto.

The pixel PX includes the first, second, and third switching elements Qh, Ql, and Qc, the first and second liquid crystal capacitors Clch and Clcl, the first and second storage capacitors Csth and Cstl, and the voltage drop capacitor Cstd. Herein, the first switching element Qh may be a first thin film transistor Qh, the second switching element Ql may be a second thin film transistor Ql, and the third switching element Qc may be a third thin film transistor Qc.

The first and the second switching elements Qh and Ql are connected to the gate line 121 and the data line 171, and the third switching element Qc is connected to the voltage drop gate line 123.

The first and the second switching elements Qh, Ql are each a three terminal element, such as a thin film transistor, that is provided in a lower display panel 100, the control terminal thereof is connected to the gate line 121, the input terminal is connected to the data line 171, and the output terminal is connected to the first and the second liquid crystal capacitors Clch and Clcl and the first and the second storage capacitors Csth and Cstl, respectively.

The third switching element Qc is also a three terminal element, such as a thin film transistor, that is provided in the lower display panel 100, the control terminal thereof is connected to the voltage drop gate line 123, the input terminal is connected to the second liquid crystal capacitor Clcl, and the output terminal is connected to the voltage drop capacitor Cstd.

The first and the second liquid crystal capacitors Clch and Clcl are formed by overlapping the first and the second subpixel electrodes 191$h$ and 191$l$ that are connected to the first and the second switching elements Qh and Ql, respectively, and the common electrode 270 of the upper display panel 200. The first and the second storage capacitors Csth and Cstl are formed by overlapping the storage electrode 129, the storage electrode line 125, and the first and the second subpixel electrodes 191$h$ and 191$l$.

The voltage drop capacitor Cstd is connected to the output terminal of the third switching element Qc and the storage electrode line 125, and is formed by overlapping the storage electrode line 125 that is provided in the lower display panel 100 and the output terminal of the third switching element Qc with an insulator therebetween.

Referring to FIG. 6, the liquid crystal display according to the exemplary embodiment of the present invention includes a plurality of gate conductors including a plurality of gate lines 121, a plurality of voltage drop gate lines 123, and a plurality of storage electrode lines 125 on an insulation substrate (not shown).

The gate line 121 and the voltage drop gate line 123 substantially extend in a horizontal direction and transfer a gate signal. The gate line 121 includes the first gate electrode 124$h$ and the second gate electrode 124$l$ that protrude upward and downward, and the voltage drop gate line 123 includes the third gate electrode 124$c$ that protrudes upward. The first gate electrode 124$h$ and the second gate electrode 124$l$ are connected to each other to form one protrusion portion.

The storage electrode line 125 substantially extends in a horizontal direction and transfers a predetermined voltage such as a common voltage Vcom. The storage electrode line 125 includes a storage electrode 129 that protrudes upward and downward, a pair of vertical portions 128 that substantially vertically extend downward in respect to the gate line 121, and a horizontal portion 127 that connects ends of the pair of vertical portions 128 to each other. The horizontal portion 127 includes a capacitive electrode 126 that expands downward.

On the gate conductors 121, 123, and 125, a gate insulating layer (not shown) is formed.

On the gate insulating layer 140, a semiconductor that may be made of amorphous or crystalline silicon is disposed. The semiconductor includes first and second semiconductors 154h and 154l that extend toward the first and the second gate electrodes 124h and 124l and are connected to each other, and a third semiconductor 154c that is connected to the second semiconductor 154l. The third semiconductor 154c extends to form a fourth semiconductor 157.

On the semiconductor, a plurality of ohmic contact stripes (not shown) are formed, a first ohmic contact (not shown) is formed on the first semiconductor 154h, and a second ohmic contact (not shown) and a third ohmic contact (not shown) are formed on the second semiconductor 154l and the third semiconductor 154c, respectively.

On the ohmic contacts, a data conductor that includes a plurality of data lines 171, a plurality of first drain electrodes 175h, a plurality of second drain electrodes 175l and a plurality of third drain electrodes 175c is formed.

The data line 171 transfers a data signal and substantially extends in a vertical direction to cross the gate line 121 and voltage drop gate line 123. Each data line 171 includes a first source electrode 173h and a second source electrode 173l that extend toward the first gate electrode 124h and the second gate electrode 124l to form a W-shape together.

The first drain electrode 175h, the second drain electrode 175l, and the third drain electrode 175c include wide end portions and the other rod-shaped end portions. The rod-shaped end portions of the first drain electrode 175h and the second drain electrode 175l are partially surrounded by the first source electrode 173h and the second source electrode 173l. The wide end portion of the second drain electrode 175l further extends to form a U-shaped third source electrode 173c. The wide end portion 177c of the third drain electrode 175c overlaps the capacitive electrode 126 to form the voltage drop capacitor Cstd and the rod-shaped end portion is partially surrounded by the third source electrode 173c.

The first, second, and third gate electrodes 124h, 124l, and 124c, the first, second, and third source electrodes 173h, 173l, and 173c, and the first, second, and third drain electrodes 175h, 175l, and 175c form first, second, and third thin film transistors (TFT) Qh, Ql, and Qc together with the semiconductor islands 154h, 154l, and 154c, respectively. A channel of the thin film transistor is formed in each of the semiconductors 154h, 154l, and 154c between each of the source electrodes 173h, 173l, and 173c and each of the drain electrodes 175h, 175l, and 175c.

A semiconductor stripe 151 that includes the semiconductors 154h, 154l, and 154c has substantially the same flat surface shape as the data conductors 171, 175h, 175l, and 175c and the ohmic contacts therebeneath with the exception of the channel region between the source electrodes 173h, 173l, and 173c and the drain electrodes 175h, 175l, and 175c. That is, in the semiconductor stripe 151 that includes the semiconductors 154h, 154l, and 154c, there are spaces between the source electrodes 173h, 173l, and 173c and the drain electrodes 175h, 175l, and 175c, and an exposed portion that is not covered by the data conductors 171, 175h, 175l, and 175c.

A lower passivation layer (not shown) that may be made of an inorganic insulator such as silicon nitride or silicon oxide is disposed on the data conductors 171, 175h, 175l, 175c and the exposed portion of the semiconductors 154h, 154l, and 154c.

A color filter 230 is disposed on the lower passivation layer. The color filter 230 is disposed on most regions with the exception of regions on which the first thin film transistor Qh, the second thin film transistor Ql, and the third thin film transistor Qc are disposed. However, the color filter 230 may longitudinally extend in a vertical direction along the data lines 171 that are adjacent to each other. Each color filter 230 may display any one of three primary colors of red, green, and blue colors.

On a region in which the color filter 230 is not disposed and a portion of the color filter 230, a light blocking member 220 is disposed. The light blocking member 220 may be called a black matrix and prevents light leakage. The light blocking member 220 extends along the gate line 121 and voltage drop gate line 123 to expand upward and downward, and includes a second light blocking member 220b that extends along the first light blocking member 220a and the data line 171 that cover the region in which the first thin film transistor Qh, the second thin film transistor Ql, and the third thin film transistor Qc are disposed. A height of a portion of the light blocking member 220 may be lower than a height of the color filter 230.

On the color filter 230 and the light blocking member 220, an upper passivation layer (not shown) is formed. The upper passivation layer prevents the color filter 230 and the light blocking member 220 from lifting and suppresses contamination of the liquid crystal layer 3 by an organic material such as a solvent that flows from the color filter 230, thereby preventing defects, such as afterimages, that may occur when an image is driven.

On the lower passivation layer, the light blocking member 220, and the upper passivation layer, a plurality of first contact holes 185h and a plurality of second contact holes 185l that expose each of the wide end portion of the first drain electrode 175h and the wide end portion of the second drain electrode 175l are formed.

On the upper passivation layer, a plurality of pixel electrodes 191 are disposed. Each pixel electrode 191 includes a first subpixel electrode 191h and a second subpixel electrode 191l that are separated from each other with two gate lines 121 and 123 therebetween and disposed above and beneath of the pixel area with the center of the gate lines 121 and 123 to be adjacent in a column direction, and the first subpixel electrode 191h and the second subpixel electrode 191l include one or more basic electrodes 199 or modifications thereof shown in FIG. 7, respectively.

Hereinafter, referring to FIG. 7, the basic electrode 199 will be described in detail. The entire shape of the basic electrode 199 is a quadrangle, and the basic electrode 199 includes a cross-shaped stem portion that is formed of a transverse stem portion 193 and a vertical stem portion 192 that is orthogonal thereto. In addition, the basic electrode 199 is divided into the first subregion Da, the second subregion Db, the third subregion Dc and the fourth subregion Dd by the transverse stem portion 193 and the vertical stem portion 192, and each of the subregions Da to Dd respectively includes a plurality of first to fourth fine branch portions 194a, 194b, 194c, and 194d.

The first fine branch portion 194a extends obliquely to an upper left direction from the transverse stem portion 193 or the vertical stem portion 192 and the second fine branch portion 194b extends obliquely to an upper right direction from the transverse stem portion 193 or the vertical stem portion 192. In addition, the third fine branch portion 194c extends obliquely to a lower left direction from the transverse stem portion 193 or the vertical stem portion 192 and the fourth fine branch portion 194d extends obliquely to a lower right direction from the transverse stem portion 193 or the vertical stem portion 192.

The first to fourth fine branch portions 194a, 194b, 194c, and 194d form an angle of approximately 45 degrees or 135 degrees with the gate lines 121a and the 121b or the transverse stem portion 193. Further, the fine branch portions 194a, 194b, 194c, and 194d of the adjacent subregions Da, Db, Dc, and Dd may be orthogonal to each other.

The widths of the fine branch portions 194a, 194b, 194c, and 194d may be in the range of 1.0 to 3.0μm and a gap between the adjacent fine branch portions 194a, 194b, 194c, and 194d in one subregion Da, Db, Dc, or Dd may be in the range of 1.0 to 3.0 μm The first subpixel electrode 191h and the second subpixel electrode 191l include a circumference stem portion that surrounds the circumference thereof, and the vertical portion of the circumference stem portion extends along the data line 171 and may prevent capacitive coupling between the data line 171 and the first subpixel electrode 191h and the second subpixel electrode 191l.

The first subpixel electrode 191h and the second subpixel electrode 191l receive a data voltage through the first contact hole 185h and the second contact hole 185l from the first drain electrode 175h and the second drain electrode 175l, respectively. The first subpixel electrode 191h and the second subpixel electrode 191l to which the data voltage is applied generates an electric field in conjunction with the common electrode 270 of the common electrode panel 200 to determine a direction of the liquid crystal molecules of the liquid crystal layer (not shown) between the two electrodes 191 and 270. As described above, according to the determined direction of the liquid crystal molecule, the luminance of light that passes through the liquid crystal layer is changed.

The side of the first to the fourth fine branch portions 194a, 194b, 194c, and 194d distorts an electric field to make a horizontal component that determines an inclination direction of the liquid crystal molecules. The horizontal components of the electric field are substantially horizontal to the sides of the first to fourth fine branch portions 194a, 194b, 194c, and 194d. Therefore, as shown in FIG. 5, the liquid crystal molecules are inclined in a direction that is parallel to a length direction of the fine branch portions 194a, 194b, 194c, and 194d. Since one pixel electrode 191 includes four subregions Da to Dd in which length directions of the fine branch portions 194a, 194b, 194c, and 194d are different from each other, the directions where the liquid crystal molecules are inclined are about four directions, and four domains where the alignment directions of the liquid crystal molecules are different from each other are formed in the liquid crystal layer. As described above, by diversifying the inclination direction of the liquid crystal molecules, the reference viewing angle of the liquid crystal display is increased.

The first subpixel electrode 191h and the common electrode (not shown) form the first liquid crystal capacitor Clch in conjunction with the liquid crystal layer 3 therebetween, and the second subpixel electrode 191l and common electrode (not shown)) form the second liquid crystal capacitor Clcl in conjunction with the liquid crystal layer therebetween, so that the applied voltage is maintained even after the first and the second thin film transistors Qh and Ql are turned off.

The first and the second subpixel electrodes 191h and 191l overlap the storage electrode 129 and the storage electrode line 125 to form the first and the second storage capacitors Csth and Cstl, and the first and the second storage capacitors Csth and Cstl strengthen the voltage maintaining ability of the first and the second liquid crystal capacitors Clch and Clcl.

The capacity electrode 126 and an extended portion 177c of the third drain electrode 175c overlap with the gate insulating layer 140 and the semiconductor layers 157 and 167 therebetween to form a voltage drop capacitor Cstd. In another exemplary embodiment of the present invention, the capacity electrode 126 and the extended portion 177c of the third drain electrode 175c that constitute the voltage drop capacitor Cstd may be reshifted from the semiconductor layers 157 and 167 that are disposed therebetween.

A coloring member 320 is formed on the upper passivation layer. The coloring member 320 is disposed on the light blocking member 220. The coloring member 320 extends along the gate line 121 and the voltage drop gate line 123, expands upward and downward, and includes a first coloring member 320a and a second coloring member 320b that are disposed along a second light blocking member 220b that extends along the first light blocking member 220a and the data line 171 that cover the region in which the first thin film transistor Qh, the second thin film transistor Ql, and the third thin film transistor Qc are disposed.

On the pixel electrode 191, the exposed upper passivation layer, and the coloring members 320a and 320b, a lower alignment layer (not shown) is formed. The lower alignment layer may be a vertical alignment layer.

The liquid crystal layer has a negative dielectric anisotropy, and the liquid crystal molecule of the liquid crystal layer 3 may be aligned so that long axes thereof are vertical in respect to the surface of the two display panels 100 and 200 in a state in which there is no electric field. Therefore, the incident light does not pass through the crossed polarizers but is blocked in a state in which there is no electric field.

Figure 8:
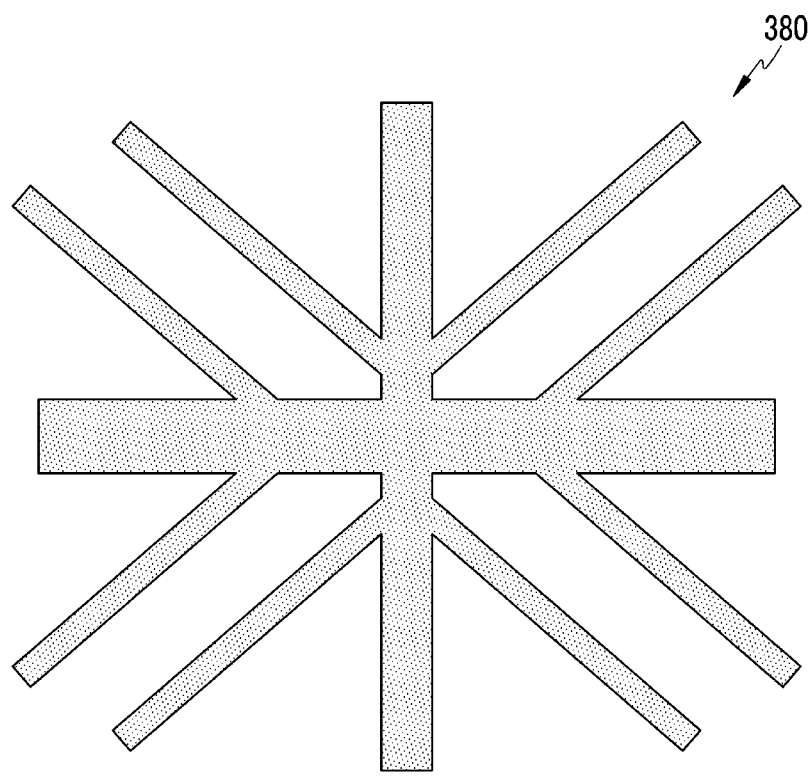
FIG. 8 illustrates an example of a photomask for forming a pixel electrode of the liquid crystal display according to an exemplary embodiment of the present invention.

Hereinafter, a method for forming a pixel electrode of a liquid crystal display according to an exemplary embodiment of the present invention will be described with reference to FIG. 8 and FIG. 9. FIG. 8 illustrates an example of a photomask for forming a pixel electrode of a liquid crystal display according to an exemplary embodiment of the present invention, and FIG. 9 is a layout view illustrating a method for forming the pixel electrode of a liquid crystal display according to an exemplary embodiment of the present invention.

Referring to FIG. 8, in the photomask 380 used in the manufacturing method of the liquid crystal display according to the present exemplary embodiment, the width of the light transmission part (coloring part) may be narrower than the width of the light shielding part, in detail, about 1CD:3CD.

Figure 9A:
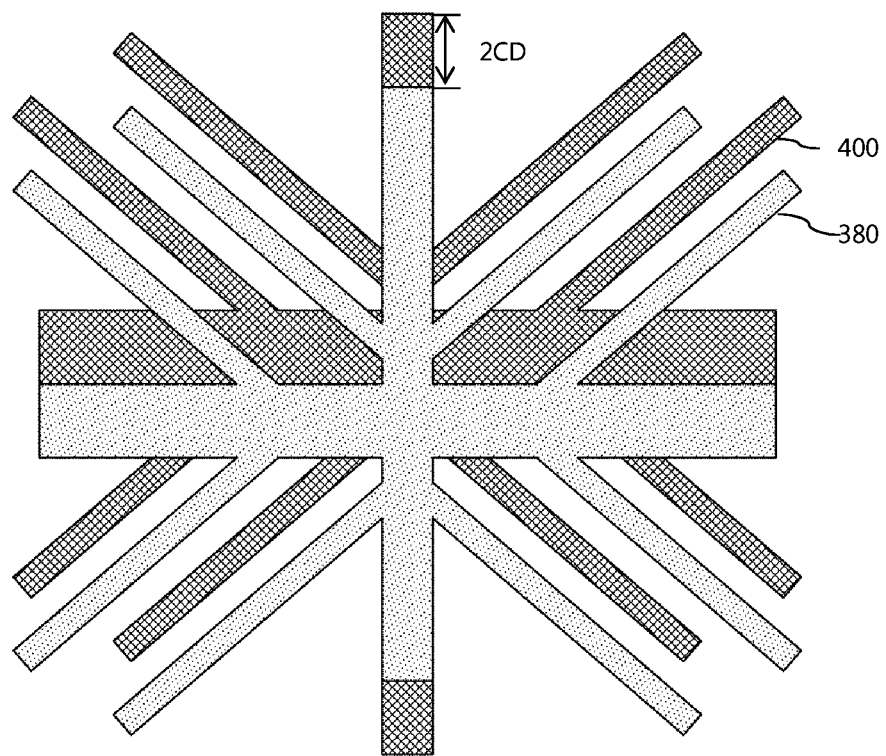
FIG. 9A is a layout view illustrating a method for forming the pixel electrode of the liquid crystal display according to an exemplary embodiment of the present invention.
Figure 9B:
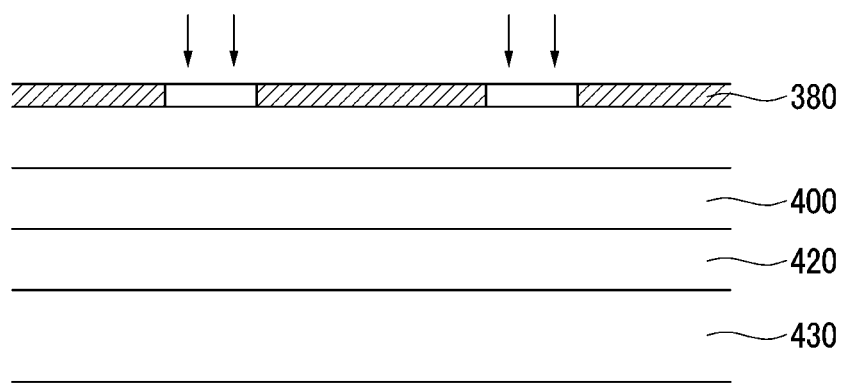
FIG. 9B is a cross-sectional drawing illustrating the arrangement of layers used in forming the pixel electrode according to an exemplary embodiment of the present invention.

The photoresist pattern 400 of the part to which light is irradiated remains, as shown in FIGS. 9A and 9B, by depositing a negative photoresist on a transparent conductive layer 420 disposed on substrate 430, performing the first exposing by using the photomask 380 of FIG. 8, shifting the photoresist or the photomask 380 by 2CD, performing the second exposing, and performing developing. FIG. 9A illustrates the part of the photomask 380 to which light is irradiated, and FIG. 9B shows a cross-section of the various layers involved in the process. After this process is repeated, it is possible to form a basic electrode of a pixel electrode having a branch electrode of a desired fine pattern by etching the transparent conductive layer 420 using the photoresist pattern 400 as an etching mask.

Thus, according to a method for forming a pattern and a method for manufacturing a display device using the same according to the exemplary embodiment of the present invention, it is possible to form a fine pattern where a width and an interval of the pattern are 1CD by first exposing a photoresist by using an exposure mask where an interval ratio of a light shielding part and a light transmission part is 2CD:1CD to 4CD:1CD, and then second exposing the photoresist after the exposure mask is shifted at a predetermined interval, or second exposing the photoresist by using an exposure mask formed at a position where a light transmission part is shifted at a predetermined interval, and developing the photoresist, such that it is possible to form a display device having a pixel electrode including a plurality of fine branch electrodes having a smaller width and interval than resolution of an exposure apparatus.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for forming a pattern, comprising:
   forming a photoresist on a substrate;
   performing a first exposure on the photoresist by using a photomask where an interval ratio of a light shielding part to a light transmission part is from 2:1 to 4:1;
   performing a second exposure on the first exposed photoresist after shifting the photomask an interval; and
   developing the second exposed photoresist.

2. The method of claim 1, wherein the interval ratio of the light shielding part to the light transmission part of the photomask is from about 2 μm:1 μm to about 4 μm:1 μm.

3. The method of claim 2, wherein a width and an interval of the pattern are each about 1 μm.

4. The method of claim 1, wherein a width and an interval of the pattern are each about 1 critical dimension.

5. A method for forming a pattern, comprising:
   forming a photoresist on a substrate;
   first exposing the photoresist by using a first photomask where an interval ratio of a light shielding part to a light transmission part is from 2:1 to 4:1;
   second exposing the first exposed photoresist by using a second photomask that has comprising a light shielding part and a light transmission part at a position that is horizontally shifted from the position of the light shielding part and the light transmission part of the first photomask, and where an interval ratio of the light shielding part to the light transmission part is from 2:1 to 4:1; and
   developing the second exposed photoresist.

6. The method of claim 5, wherein the interval ratio of the light shielding part to the light transmission part of the photomask is from about 2 μm:1 μm to about 4 μm:1 μm.

7. The method of claim 6, wherein a width and an interval of the pattern are each about 1 μm.

8. The method of claim 5, wherein a width and an interval of the pattern are each about 1 critical dimension.

9. A method for forming a display device, comprising:
   forming a conductive layer on a substrate;
   forming a photoresist on a conductive layer;
   performing a first exposure of the photoresist by using a photomask where an interval ratio of a light shielding part to a light transmission part is from 2:1 to 4:1;
   performing a second exposure of the first exposed photoresist after the photomask is horizontally shifted an interval, or performing a second exposure of the first exposed photoresist by using a second photomask comprising a light shielding part and a light transmission part at a position that is horizontally shifted from the position of the light shielding part and the light transmission part of the first photomask, and where an interval ratio of the light shielding part to the light transmission part is from 2:1 to 4:1;
   developing the second exposed photoresist; and
   forming a conductive layer pattern by etching the conductive layer by using the developed photoresist as an etching mask.

10. The method of claim 9, wherein the interval ratio of the light shielding part to the light transmission part of the photomask is from about 2 μm:1 μm to about 4 μm:1 μm.

11. The method of claim 10, wherein a width and an interval of the pattern are each about 1 μm.

12. The method of claim 9, wherein a width and an interval of the pattern are each about 1 critical dimension.

13. The method of claim 9, wherein the conductive layer is a transparent conductive layer.

14. The method of claim 1, wherein the interval ratio of the light shielding part to the light transmission part of the photomask is about 3 μm:1 μm.

15. The method of claim 5, wherein the interval ratio of the light shielding part to the light transmission part of the photomask is about 3 μm:1 μm.

16. The method of claim 9, wherein the interval ratio of the light shielding part to the light transmission part of the photomask is about 3 μm:1 μm.

17. The method of claim 1, wherein the interval is in a range from 1 critical dimension to 3 critical dimensions.

18. The method of claim 5, wherein the interval is in a range from 1 critical dimension to 3 critical dimensions.

19. The method of claim 9, wherein the interval is in a range from 1 critical dimension to 3 critical dimensions.

* * * * *